United States Patent
Harrison

(10) Patent No.: US 6,744,281 B2
(45) Date of Patent: Jun. 1, 2004

(54) METHOD AND SYSTEM FOR CONTROLLING THE DUTY CYCLE OF A CLOCK SIGNAL

(75) Inventor: Ronnie M. Harrison, Boise, ID (US)

(73) Assignee: Micron Technology, Inc., Boise, ID (US)

(*) Notice: Subject to any disclaimer, the term of this patent is extended or adjusted under 35 U.S.C. 154(b) by 29 days.

(21) Appl. No.: 10/075,517

(22) Filed: Feb. 13, 2002

(65) Prior Publication Data
US 2002/0075039 A1 Jun. 20, 2002

Related U.S. Application Data

(62) Division of application No. 09/654,226, filed on Aug. 30, 2000, now Pat. No. 6,424,178.

(51) Int. Cl.[7] ............................................. H03K 19/00
(52) U.S. Cl. ............................. 326/93; 326/28; 326/29; 326/99
(58) Field of Search .......................... 326/93–99, 26, 326/28; 327/175, 170, 298, 299, 157, 292

(56) References Cited

U.S. PATENT DOCUMENTS

| | | | | |
|---|---|---|---|---|
| 5,179,298 A | | 1/1993 | Hirano et al. | 307/443 |
| 5,621,360 A | * | 4/1997 | Huang | 331/57 |
| 5,812,619 A | | 9/1998 | Runaldue | 375/376 |
| 6,011,732 A | | 1/2000 | Harrison et al. | 365/194 |
| 6,060,922 A | | 5/2000 | Chow et al. | 327/175 |
| 6,084,452 A | * | 7/2000 | Drost et al. | 327/175 |
| 6,119,242 A | | 9/2000 | Harrison | 713/503 |
| 6,125,157 A | | 9/2000 | Donnelly et al. | 375/371 |
| 6,198,322 B1 | | 3/2001 | Yoshimura | 327/175 |
| 6,320,438 B1 | | 11/2001 | Arcus | 327/175 |
| 6,340,904 B1 | | 1/2002 | Manning | 327/156 |
| 6,420,920 B1 | * | 7/2002 | Huber et al. | 327/257 |
| 6,424,178 B1 | | 7/2002 | Harrison | 326/93 |
| 6,445,644 B2 | | 9/2002 | Sher | 365/233 |
| 6,469,555 B1 | | 10/2002 | Lau et al. | 327/158 |
| 6,486,713 B2 | | 11/2002 | Wright et al. | 327/108 |
| 6,504,409 B1 | | 1/2003 | Laletin | 327/175 |
| 6,522,160 B1 | | 2/2003 | Zivanovic | 324/765 |
| 6,526,109 B1 | | 2/2003 | Chang et al. | 375/371 |
| 6,539,072 B1 | | 3/2003 | Donnelly et al. | 375/371 |

* cited by examiner

Primary Examiner—Anh Tran
(74) Attorney, Agent, or Firm—Dorsey & Whitney, LLP

(57) ABSTRACT

A system for controlling the duty cycle of a clock signal. The system includes a duty cycle adjustment circuit that receives an input clock signal and generates an output clock signal. The duty cycle adjustment circuit charges a capacitor when the input clock signal has a first logic level and discharges the capacitor with the input clock signal has a second logic level. The rates of charge and discharge are controlled by first and second control signals. When the capacitor has been charged to a first transition level, the output clock signal transitions to a first logic level, and when the capacitor has been discharged to a second transition level, the output clock signal transitions to a second logic level. The first and second control signals are supplied by a feedback circuit, which is implemented using an integrator circuit that receives the output clock signal and generates a feedback signal indicative of the duty cycle of the output clock signal. A transconductance amplifier compares the feedback signal to a reference voltage, and generates first and second currents corresponding thereto. These currents are converted to the first and second control signals by a control circuit, which includes a current mirror. The control circuit provides good immunity from power supply fluctuations.

24 Claims, 5 Drawing Sheets

METHOD AND SYSTEM FOR CONTROLLING THE DUTY CYCLE OF A CLOCK SIGNAL

CROSS-REFERENCE TO RELATED APPLICATION

This application is a divisional of pending U.S. patent application Ser. No. 09/654,226, now U.S. Pat. No. 6,424,178 filed Aug. 30, 2000.

TECHNICAL FIELD

This invention relates to clock signal circuits, and more particularly to a method and system for controlling the duty cycle of an output clock signal independently of the duty cycle of an input clock signal.

BACKGROUND OF THE INVENTION

Clock signals are commonly used for a variety of purposes in digital systems, such as memory devices. For example, in a synchronous dynamic random access memory ("SDRAM"), a clock signal is used to determine the time at which control, data and address signals applied to the SDRAM are considered valid. The control, data and address signals are then latched into the SDRAM responsive to a transition of the clock signal.

In some cases, the duty cycle of the clock signal is not critical. For example, if the clock signal is used to latch a memory control signal once for each period of the clock signal, the control signal will be latched at the proper time regardless of whether the clock signal has a 50% duty cycle. However, controlling the duty cycle is critical in other applications. For example, in "double data rate" DRAMs, control, data and/or address signals are latched on each transition of the clock signal, i.e., on both the rising and falling edges of the clock signals. If the clock signal does not have a 50% duty cycle, the latching of the signals will not be symmetrical, and the clock signal may therefore fail to properly latch the signals.

The duty cycle of a clock signal can become skewed, i.e., vary from a 50% duty cycle, for a variety of reasons. For example, the clock signal may be coupled through a switching circuit that changes state when the clock signal has a predetermined voltage relative to the power supply voltage. In such case, power supply noise can momentarily increase or decrease the supply voltage, thereby altering the time at which the clock signal transitions. The duty of the clock signal can then vary from cycle-to-cycle. In other cases, the components used in a circuit having a symmetrical topography do not have the same electrical characteristics, thus causing them to operate differently. For example, a first transistor used in the circuit may have a resistance or threshold voltage that is different from the resistance or threshold voltage of a second transistor used in the circuit. In such cases, the duty cycle will be constant from cycle-to-cycle, but the duty cycle will vary from 50%.

There is therefore a need for a system and method for controlling the duty cycle of a clock signal in a manner that is not affected by variations in power supply voltage or electrical characteristics of circuit components, so that a clock signal having a duty cycle of 50% or some other value can be generated.

SUMMARY OF THE INVENTION

A method and system for generating an output clock signal having a controllable duty cycle from an input clock signal in accordance with the invention includes a duty cycle corrector circuit coupled to a duty cycle indicating circuit through a control circuit. The duty cycle corrector circuit is structured to transition the output clock signal to a first logic level responsive to a first transition of the input clock signal after a first delay that corresponds to a first control signal. The duty cycle corrector circuit is also structured to further transition the output clock signal to a second logic level that is different from the first logic level responsive to a second transition of the input clock signal that is different from the first transition of the input clock signal after a second delay that corresponds to a second control signal. The duty cycle indicating circuit is coupled to receive the output clock signal, and it generates a duty cycle feedback signal corresponding to the duty cycle of the output clock signal. The control circuit is structured to generate the first and second control signals as a function of the duty cycle feedback signal so that the first and second delays are selected to cause the output clock signal to have a predetermined duty cycle.

DETAILED DESCRIPTION OF THE INVENTION

Figure 1:
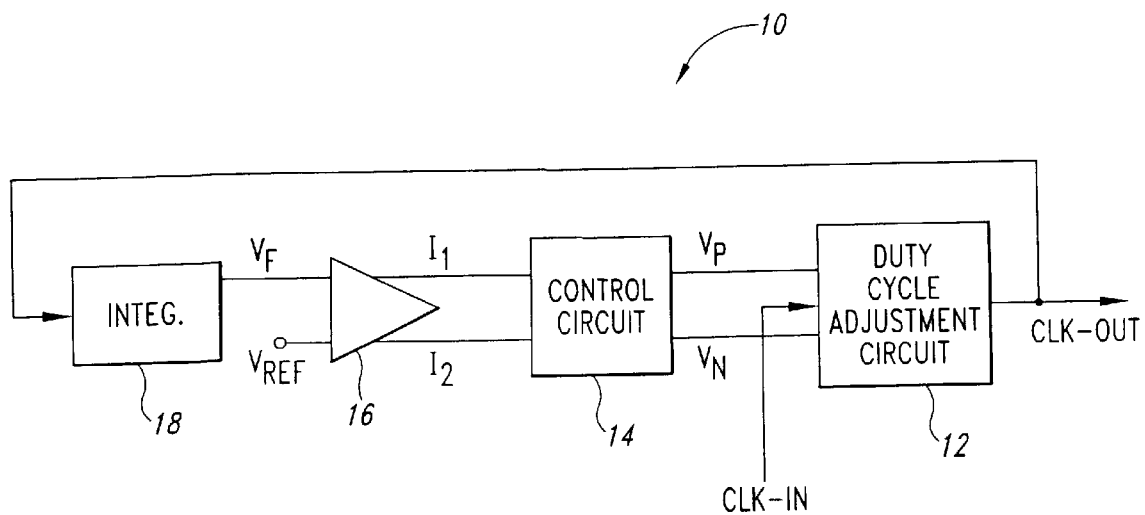
FIG. 1 is a block diagram of a system for controlling the duty cycle of a clock signal according to an embodiment of the invention.

One embodiment of a system 10 for controlling the duty cycle of a clock signal in accordance with the invention is illustrated in FIG. 1. The system 10 includes a duty cycle adjustment circuit 12 that receives a clock signal CLK-IN and outputs a corresponding duty cycle adjusted output signal CLK-OUT. The adjustment circuit 12 also receives a pair of control signals $V_P$, $V_N$ from a control circuit 14. As explained in greater detail below, the control signals $V_P$, $V_N$ control the duration that the CLK-OUT signal is at two respective logic levels in order to control the duty cycle of the output signal CLK-OUT.

The control circuit 14 generates the control signals $V_P$, $V_N$ responsive to a pair of output signals $I_1$, $I_2$ from a transconductance amplifier 16. The current of the output signals $I_1$, $I_2$ produced by the transconductance amplifier is a function of the difference between a reference voltage $V_{REF}$ and the magnitude of a feedback signal $V_F$ from the output of an integrator 18. As explained in greater detail below, the feedback signal $V_F$ from the integrator 18 is a function of the percent of time that the output signal CLK-OUT is at each of two logic levels, i.e., the duty cycle. An increase in the duty cycle, i.e., the time the output signal CLK-OUT is at a first logic level relative to the time that it is at a second logic level, causes the magnitude of the feedback signal $V_F$ to increase. Conversely, a decrease in the duty cycle causes the magnitude of the feedback signal $V_F$ to decrease.

The overall operation of the system 12 of FIG. 1 will now be explained. The duty cycle adjustment circuit 12 outputs the CLK-OUT signal responsive to the CLK-IN signal. The integrator 18 receives the CLK-OUT signal and outputs the feedback signal $V_F$ as a function of the duty cycle of the CLK-OUT signal. The transconductance amplifier 16 generates the output signals $I_1$, $I_2$ in a manner causing that the sum of the current of output signals $I_1$, $I_2$ to be constant. However, the difference between current of output signals $I_1$, $I_2$ is a function of the difference between the magnitude of the feedback signal $V_F$ and the magnitude of the reference voltage $V_{REF}$. As mentioned above, the output signals $I_1$, $I_2$ cause the control circuit 14 to output corresponding control signals $V_P$, $V_N$, which control the duty cycle of the CLK-OUT output signal. As explained in greater detail below, the system 10 is substantially insensitive to variations in the magnitude of its power supply voltages, thus making the system less susceptible to noise jitter.

Although, the duty cycle of the CLK-OUT signal will generally be controlled so that it is substantially 50%, it will be understood that the system 10 is capable of setting the duty cycle to other values simply by varying the ratio Ip/In, as explained below with respect to FIG. 4 magnitude of the reference voltage $V_{REF}$. The system 10 will automatically adjust the duty cycle of the CLK-OUT signal so that the magnitude of the feedback signal $V_F$ from the integrator 18 approximately equals the magnitude of the reference voltage $V_{REF}$.

Figure 2:
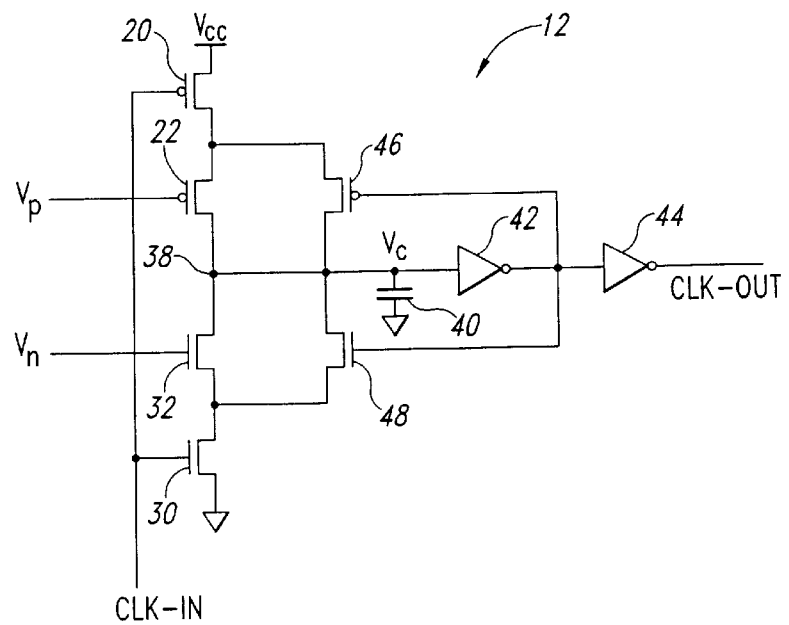
FIG. 2 is a schematic of a duty cycle adjusting circuit according to an embodiment of the invention that is used in the system of FIG. 1.

One embodiment of the duty cycle adjustment circuit 12 of FIG. 1 is shown in FIG. 2. The adjustment circuit 12 includes a series of two PMOS transistors 20, 22 and two NMOS transistors 30, 32 coupled between a supply voltage $V_{CC}$ and ground. The gates of one of the PMOS transistors 20 and one of the NMOS transistors 30 are coupled to each other to receive the CLK-IN signal. As a result, the PMOS transistor 20 and the NMOS transistor 30 essentially function together as an inverter so that an output node 38 is coupled to ground when the CLK-IN signal is high and is coupled to the supply voltage $V_{CC}$ when the CLK-IN signal is low.

The impedance between the supply voltage $V_{CC}$ and the output node 38 is controlled by adjusting the level of the control signal $V_P$ applied to the gate of the PMOS transistor 22. Similarly, the impedance between the output node 38 and ground is controlled by adjusting the level of the control signal $V_N$ applied to the gate of the NMOS transistor 32.

The output node 38 is coupled to a capacitor 40 and to an input of an inverter 42. Therefore, when the PMOS transistor 20 is turned ON responsive to the CLK-IN signal being low, the capacitor 40 charges through the PMOS transistors 20, 22. Similarly, when the NMOS transistor 30 is turned ON responsive to the CLK-IN signal being high, the capacitor 40 discharges through the NMOS transistors 30, 32. The rate at which the capacitor 40 is charged and discharged is determined by the magnitude of the control signals $V_P$ and $V_N$, respectively. When the capacitor 40 has been charged to a high transition voltage of the inverter 42, the output of the inverter transitions low. When the capacitor 40 has been discharged to a low transition voltage of the inverter 42, the output of the inverter transitions high. The output of the inverter 42 is coupled through a second inverter 44, which functions as a buffer, to generate the output signal CLK-OUT.

The duty cycle adjustment circuit 12 also includes a positive feedback PMOS transistor 46 and a positive feedback NMOS transistor 48. When the capacitor 40 has been discharged to the low transition voltage, the output of the inverter 42 transitions high, thereby turning ON the NMOS transistor 48. The ON impedance of the transistor 48 is substantially lower than the impedance of the NMOS transistor 32. As a result, turning the transistor 48 ON causes a substantial decrease in the impedance between the output node 38 and ground, thereby quickly discharging the capacitor 40. Similarly, when the capacitor 40 has been charged to the high transition voltage, the output of the inverter 42 transitions low, thereby turning ON the PMOS transistor 46. The ON impedance of the transistor 46 is substantially lower than the impedance of the PMOS transistor 22. As a result, turning the transistor 46 ON causes a substantial decrease in the impedance between the supply voltage $V_{CC}$ and the output node 38, thereby quickly charging the capacitor 40. The positive feedback transistors 46, 48 ensure that the capacitor 40 is always charged from ground potential each time the CLK-IN transitions low, and is always discharged from ground potential each time the CLK-IN transitions high. The resulting repeatability of the charge and discharge cycles ensures that the duty cycle of the CLK-OUT signal is accurately controlled by the control signals $V_P$ and $V_N$.

Figure 3:
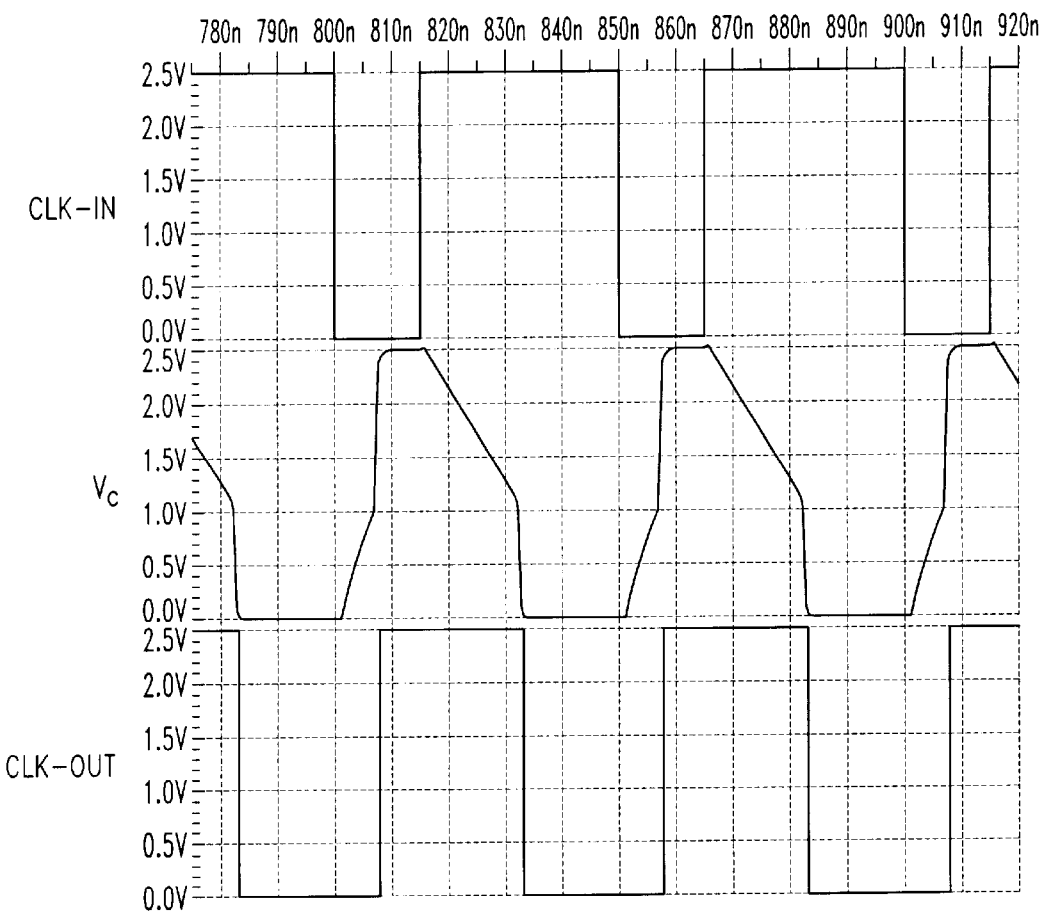
FIG. 3 are timing diagrams showing the waveforms present in the duty cycle adjusting circuit of FIG. 2.

The operation of the duty cycle adjustment circuit 12 will now be summarized with reference to the timing diagram of FIG. 3. As shown therein, the CLK-IN signal has a duty cycle that is substantially greater than 50%. When the CLKIN signal transitions high at time 815 ns, the NMOS transistor 30 turns ON, thereby discharging the capacitor 40 through the NMOS transistors 30, 32. At time 832 ns, when the voltage $V_C$ on the capacitor 40 has been discharged to the lower transition voltage of the inverter 42, the output of the inverter 42 transitions high, thereby causing the CLK-OUT signal to transition low, as shown in FIG. 3. The low-to-high transition of the inverter 42 output also turns ON the NMOS positive feedback transistor 48, thereby quickly discharging the capacitor 40. As a result, the voltage $V_C$ on the capacitor 40 reaches ground potential and is maintained there well before the CLK-IN signal transitions low at time 850 ns.

When the CLK-IN signal transitions low at time 850 ns, the PMOS transistor 20 turns ON, thereby charging the capacitor 40 through the PMOS transistors 20, 22. At time 857 ns, when the voltage $V_C$ on the capacitor 40 has been charged to the higher transition voltage of the inverter 42, the output of the inverter 42 transitions low, thereby causing the CLK-OUT signal to transition high. The PMOS positive feedback transistor 46 is also turned ON at this time, thereby quickly charging the capacitor 40. As a result, the voltage $V_C$ on the capacitor 40 reaches the supply voltage $V_{CC}$ and is maintained there until the CLK-IN signal transitions high at time 865 ns.

Notice that the capacitor 40 is discharged at a rate that is substantially slower than the rate at which the capacitor 40 is charged. As a result, the duty cycle of the CLK-OUT signal is maintained at 50%. The charge and discharge rates are adjusted in this manner by the magnitudes of the control voltages $V_P$ and $V_N$, which control the impedance of the transistors 22, 32, respectively. As explained above, the negative feedback of the system 10 automatically adjusts the magnitudes of the $V_P$ and $V_N$ signals in this manner.

Figure 4:
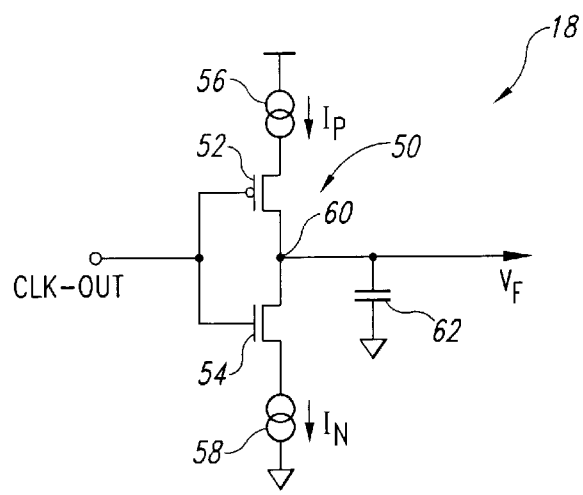
FIG. 4 is a schematic of an integrator circuit according to an embodiment of the invention that is used in the system of FIG. 1.

One embodiment of the integrator 18 is shown in FIG. 4. The integrator 18 includes an inverter 50 formed by a PMOS transistor 52 coupled in series with an NMOS transistor 54, with the gates of the transistors 52, 54 coupled to each other. The transistors 50, 52 are coupled in series with a current source 56 and a current sink 58 between a supply voltage $V_{CC}$ and ground. An output node 60 of the inverter 50 is coupled to a capacitor 62 to supply the feedback voltage $V_F$.

In operation, when the CLK-OUT signal is low, the NMOS transistor 54 is turned OFF and the PMOS transistor 52 is turned ON to couple the current source 56 to the capacitor 62. The capacitor 62 is then charged linearly toward $V_{CC}$. When the CLK-OUT signal is high, the PMOS transistor 52 is turned OFF and the NMOS transistor 54 is turned ON to couple the capacitor 62 to the current sink 58. The capacitor 62 is then discharged linearly toward ground. If the currents Ip and In are equal, then $V_F$ will be constant only if the duty cycle is 50%. If the duty cycle is other than 50%, the signal $V_F$ will charge to adjust the voltages $V_P$, $V_N$ (FIG. 2) until the duty cycle is 50%. Although one embodiment of the integrator 18 is shown in FIG. 4, will be understood that a variety of integrator designs, both linear in the non-linear, as well as other circuits may be used to provide a voltage indicative of the duty cycle of the CLK-OUT signal.

Figure 5:
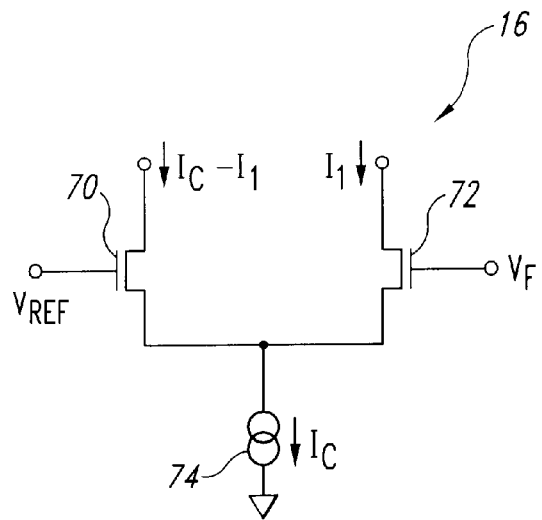
FIG. 5 is a schematic of a transconductance amplifier according to an embodiment of the invention that is used in the system of FIG. 1.

One embodiment of the transconductance amplifier 16 is shown in FIG. 5. The transconductance amplifier 16 includes a pair of NMOS transistors 70, 72 that have their drains connected to each other and to ground through a constant current sink 74, which draws a constant current $I_C$. The gate of the transistor 70 is coupled to receive the reference voltage $V_{REF}$ while the gate of the other transistor 72 is coupled to the integrator 18 (FIGS. 1 and 4) to receive the feedback voltage $V_F$. Since the current sink 74 draws a constant current $I_C$, the sum of the currents through the transistors 70, 72 is constant. The transistors 72 thus passes a current $I_1$ while the transistor 70 passes a current $I_C-I_1$.

In operation, when the feedback voltage $V_F$ increases relative to the reference voltage $V_{REF}$, the current $I_1$, passing through the transistors 72 increases while the current $I_C-I_1$ passing through the transistors 70 decreases. Conversely, when the feedback voltage $V_F$ decreases relative to the reference voltage $V_{REF}$, the current $I_1$ passing through the transistors 72 decreases while the current $I_C-I_1$ passing through the transistors 70 increases. Since the magnitude of the feedback voltage $V_F$ is inversely proportional to the duty cycle, the magnitude of the current $I_1$ is inversely proportional to the duty cycle.

Figure 6:
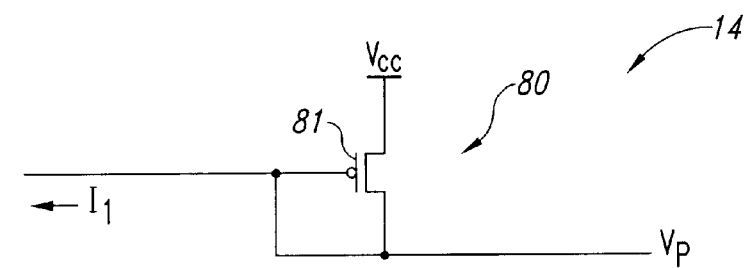
FIG. 6 is a schematic of a current mirror circuit according to an embodiment of the invention that is used in the system of FIG. 1.
Figure 6:
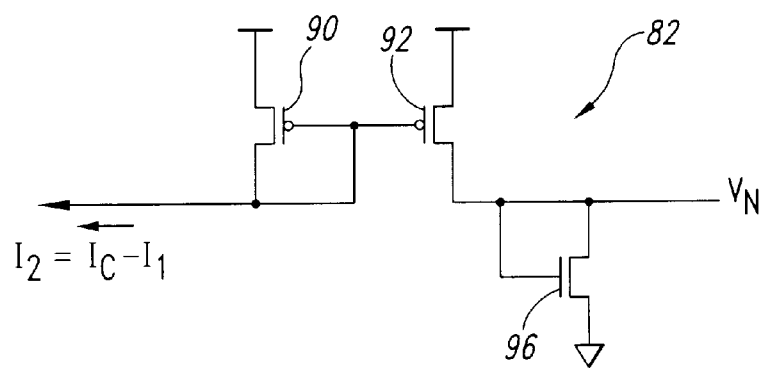

One embodiment of the control circuit 14 (FIG. 1) is illustrated in FIG. 6. The control circuit 14 includes a first branch 80 and a second branch 82. The first branch 80 includes a single PMOS transistor 86 having its source connected to the supply voltage $V_{CC}$ and its gate and drain coupled to each other and to the drain of the NMOS transistor 72 (FIG. 5) and the gate of the NMOS transistor 22 (FIG. 2). The PMOS transistor 86 is thus connected as a diode so that the current $I_1$ flowing through the transistor is directly proportional (but not necessarily linearly proportional) to the voltage across the transistor 86. As a result, the voltage $V_P$ is inversely proportional to the current $I_1$. Since the current $I_1$ is inversely proportional to the duty cycle, the magnitude of the voltage $V_P$ is directly proportional to the duty cycle.

As the duty cycle increases, the increased magnitude of the voltage $V_P$ decreases the current charging the capacitor 40 (FIG. 2) thereby causing the input to the inverter 42 to increase to a voltage above the high transition voltage of the inverter 42 a later point in time. As a result, the duty cycle of the CLK-OUT signal is decreased. Conversely, as the duty cycle decreases, the decreased magnitude of the voltage $V_P$ increases the current charging the capacitor 40 (FIG. 2) thereby causing the input to the inverter 42 to increase to a voltage above the high transition voltage of the inverter 42 an earlier point in time. As a result, the duty cycle of the CLK-OUT signal is increased.

The second branch 82 includes a pair of PMOS transistors 90, 92 having their gates coupled to each other and to the drain of the transistor 90. The drain of the transistor 90 is also coupled to the drain of the NMOS transistor 70 (FIG. 5). The transistors 90, 92 operate as a current mirror in which the current $I_C-I_1$ through the transistor 90 sets the source-to-drain voltage and the source-to-gate voltages of the transistor 90. However, since the gate of the transistor 90 is also coupled to the gate of the transistor 92, the current $I_C-I_1$ also sets the source-to-gate voltage of the transistor 92. Because both transistors 90, 92 have the same source-to-gate voltage, the current through the transistor 92 is the same as the current through the transistor 90, i.e., $I_C-I_1$.

The current flowing through the transistor 92 passes through an NMOS transistor 96, which has its gate and drain interconnected to form a diode. The voltage $V_N$ is thus proportional to the current $I_C-I_1$. Since the current $I_1$ is inversely proportional to the duty cycle, the current $I_C-I_1$ through the transistor 92 is directly proportional to the duty cycle. Therefore, the magnitude of the voltage $V_N$ is directly (but not necessarily linearly) proportional to the duty cycle. As the duty cycle increases, the increased magnitude of the voltage $V_N$ increases the current discharging the capacitor 40 (FIG. 2) thereby causing the input to the inverter 42 to decrease to a voltage below the low transition voltage of the inverter 42 an earlier point in time. As a result, the duty cycle of the CLK-OUT signal is decreased. Conversely, as the duty cycle decreases, the decreased magnitude of the voltage $V_N$ decreases the current discharging the capacitor 40 (FIG. 2) thereby causing the input to the inverter 42 to decrease to a voltage below the low transition voltage of the inverter 42 a later point in time. As a result, the duty cycle of the CLK-OUT signal is increased.

In summary, an increase in the duty cycle of the CLK-OUT signal causes the integrator 18 (FIG. 4) to reduce the magnitude of the feedback voltage $V_F$. The reduced magnitude of the feedback voltage $V_F$ causes the transconductance amplifier 16 (FIG. 5) to reduce the current $I_1$ and increase the current $I_C-I_1$. The reduced current $I_1$ causes the magnitude of the voltage $V_P$ to increase, and the increased current $I_C-I_1$ causes the magnitude of the voltage $V_N$ to increase. With reference to FIG. 2, the increased magnitude of the voltages $V_P$, $V_N$ decrease the charge rate and increase the discharge rate of the capacitor 40. As a result, the percentage of time that the capacitor 40 remains discharged to a voltage below the high transition voltage of the inverter 42 increases. The duty cycle of the signal CLK-OUT is thus decreased.

A decrease in the duty cycle of the CLK-OUT signal causes the integrator 18 (FIG. 4) to increase the magnitude of the feedback voltage $V_F$. The increased magnitude of the feedback voltage $V_F$ causes the transconductance amplifier 16 (FIG. 5) to increase the current $I_1$ and decrease the current $I_C-I_1$, thereby causing the magnitude of the voltages $V_P$ and $V_N$ to decrease. The increased magnitude of the voltages $V_P$, $V_N$ increase the charge rate and decrease the discharge rate of the capacitor 40. As a result, the percentage of time that the capacitor 40 remains charged to a voltage above the low transition voltage of the inverter 42 increases. The duty cycle of the signal CLK-OUT is thus increased.

An advantageous property of the control circuit 14 operating combination with the duty cycle adjustment circuit 12 is its good immunity from variations in the power supply voltage $V_{CC}$ or ground potential. With reference to FIGS. 2 and 4, the magnitude of the control signal $V_P$ is equal to the power supply voltage $V_{CC}$ less the threshold voltage of the transistor 86. Although, as explained above, the threshold voltage is a function of the current $I_1$, variations in the supply voltage $V_{CC}$ are coupled to directly to the gate of the PMOS transistor 22 (FIG. 2). However, when the transistor 20 is turned ON, the voltage on the source at the transistor 22 is equal to the supply voltage $V_{CC}$. Therefore, the voltages on both the gate and the source of the transistor 22 vary with the supply voltage $V_{CC}$ so that the source-to-gate voltage of the transistor 22 is constant despite variations in the supply voltage $V_{CC}$. Similarly, variations in the supply voltage $V_{CC}$ are coupled to the gates of the transistors 90, 92. However, since the voltage on the source of the transistor 92 also varies with $V_{CC}$, the source-to-gate of voltage of the transistor 92 is insensitive to variations in the supply voltage $V_{CC}$. The current flowing through the transistor 96 is thus constant despite variations in the supply voltage $V_{CC}$.

During the discharge of the capacitor, variations in the ground potential are more critical than variations in the supply voltage $V_{CC}$ because variations in ground potential may affect the rate at which the capacitor 40 is discharged. However, variations in ground potential are coupled to the control voltage $V_N$ in the same manner that variations in the supply voltage $V_{CC}$ are coupled to the control signal $V_P$. Since the source of the NMOS transistor 32 is also at ground potential, the source-to-gate voltage of the transistor 32 is constant despite variations in ground potential. As a result, the charge and discharge rates of the capacitor 40 are insensitive to variations in the supply voltages, i.e., $V_{CC}$ and ground.

Figure 7:
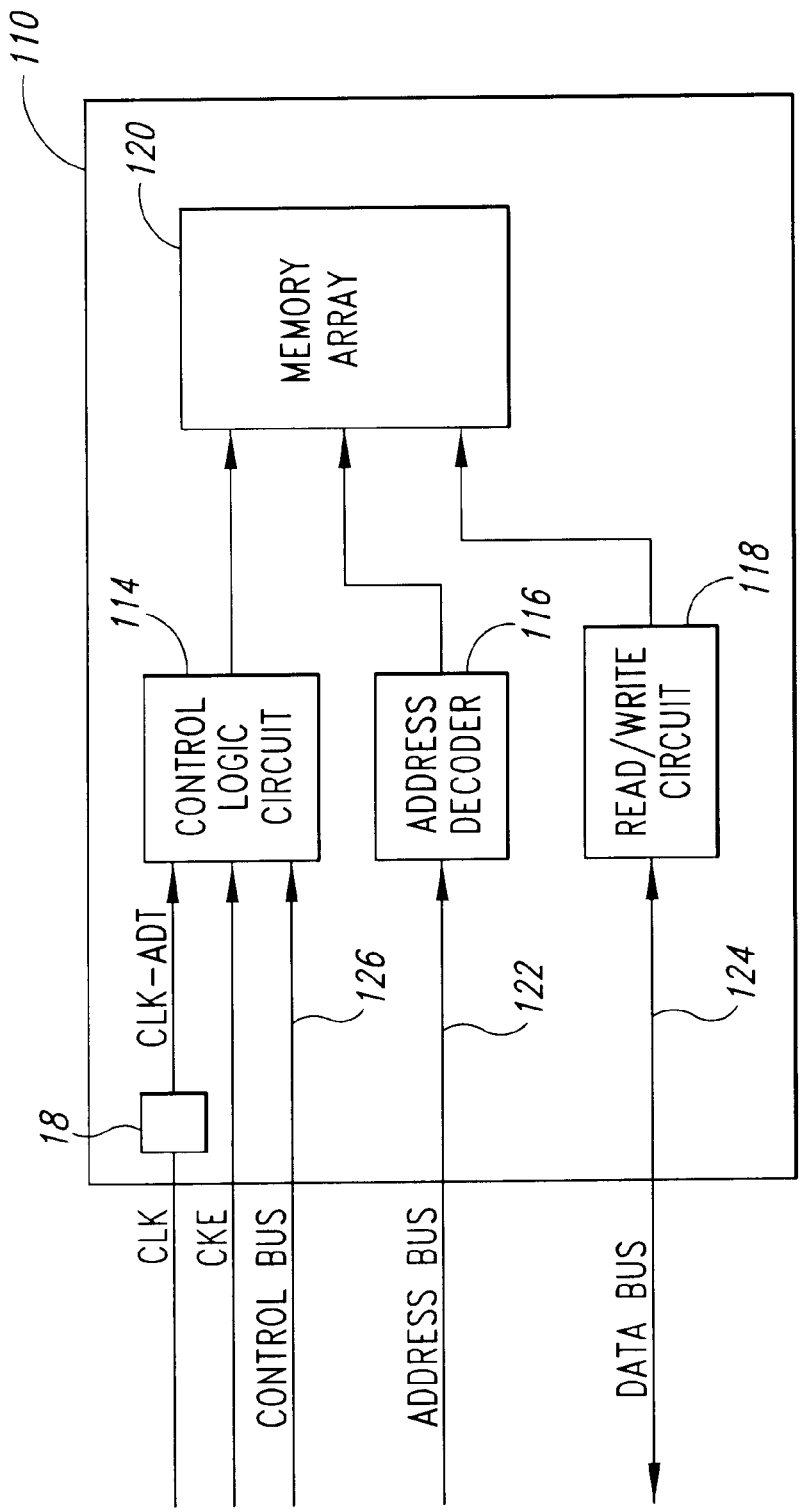
FIG. 7 is a block diagram of an embodiment of a synchronous dynamic random access memory containing a system for controlling the duty cycle of a clock signal in accordance with the invention.

Although the duty cycle correction system 10 may be used in a variety of devices, it is shown in FIG. 7 as part of a synchronous dynamic random access memory 110 ("SDRAM"). The SDRAM 110 includes a control logic circuit 114, an address decoder 116, and a read/write circuit 118, all of which are coupled to a memory array 120. As is well known in the art, the address decoder 116 receives an address over an address 1 bus 22 and provides a decoded address to the memory array 120 to select an individual memory cell in the memory array. The read/write circuit 118 operates to receive data over a data bus 124 and provide that data to the memory array 120 during a write operation, and to provide data from the memory array to the data bus during a read operation.

The SDRAM 110 performs data transfer operations under control of the control logic circuit 114 which receives data, transfer commands, including read or write commands, over a control bus 126. In response to these data transfer commands, the control logic circuit 114 executes each of the steps required to perform a read or write data transfer operation. The SDRAM 110 also receives a CLK to control the timing of various operations. The CLK signal may have a duty cycle that varies from a desired value, such as 50%. As a result, the CLK is applied to the duty cycle correction system 18 to generate the CLK-ADJ signal. The control logic circuit 114 executes each of the requisite steps synchronously, with the timing of each step being established relative to a rising edge of the adjusted clock signal CLK-ADJ. A clock enable signal CKE enables the clocking of the control logic circuit 114 by the adjusted clock signal CLK-ADJ.

Figure 8:
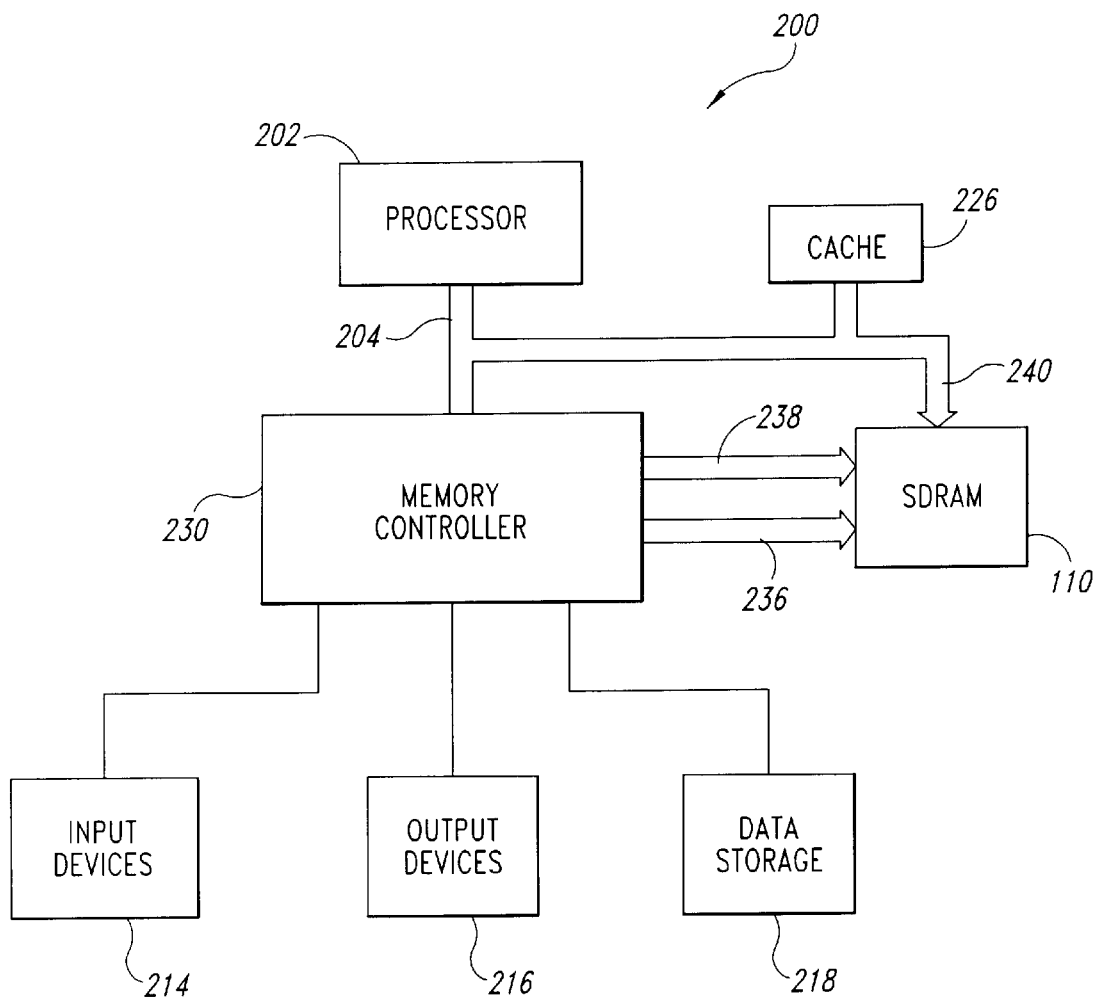
FIG. 8 is a block diagram of a computer system using the SDRAM of FIG. 7 including the duty cycle correction system of FIG. 1.

FIG. 8 shows a computer system 200 containing the SDRAM 110 of FIG. 7 using the duty cycle correction system 18 of FIG. 1. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 110 through a memory controller 230. The memory controller 230 normally includes a control bus 236 and an address bus 238 that are coupled to the SDRAM 110. A data bus 240 may be coupled to the processor bus 204 either directly (as shown), through the memory controller 230, or by some other means.

From the foregoing it will be appreciated that, although specific embodiments of the invention have been described herein for purposes of illustration, various modifications may be made without deviating from the spirit and scope of the invention. For example, the functions performed by the components shown in FIG. 1 may be combined so that they are performed by a fewer number of components or expanded so that they are performed by a greater number of components. Additionally, a variety of circuits may be used in place of the circuits shown in FIGS. 2 and 4–6. Accordingly, the invention is not limited except as by the appended claims.

What is claimed is:

1. A memory device, comprising:
   an array of memory cells;
   an address decoder adapted to receive an address and to specify a location in the array of memory cells corresponding thereto;
   a read/write circuit coupling data to and from the specified location in the array of memory cells;
   a control logic circuit receiving command signals and generating control signals corresponding thereto; and
   a clock generator circuit receiving an input clock signal and generating from the input clock signal an output clock signal having a controllable duty cycle, the clock generator circuit comprising:
   a duty cycle corrector circuit structured to generate the output clock signal from the input clock signal, the duty cycle corrector circuit being structured to transition the output clock signal to a first logic level responsive to a first transition of the input clock signal after a first delay that corresponds to a first control signal, the duty cycle corrector circuit being structured to further transition the output clock signal to a second logic level that is different from the first logic level responsive to a second transition of the input clock signal that is different from the first transition of the input clock signal after a second delay that corresponds to a second control signal;

a duty cycle indicating circuit coupled to receive the output clock signal from the duty cycle corrector circuit and to generate a duty cycle feedback signal corresponding thereto; and a control circuit coupled to the duty cycle indicating circuit and the duty cycle corrector circuit, the control circuit being structured to generate the first and second control signals as a function of the duty cycle feedback signal so that the first and second delays are selected to cause the output clock signal to have a predetermined delay.

2. The memory device of claim 1 wherein the duty cycle indicating circuit comprises an integrator circuit coupled to receive the output clock signal from the duty cycle corrector circuit and to generate as the duty cycle feedback signal a signal corresponding to the integral of the output clock signal with respect to time.

3. The memory device of claim 2 wherein the integrator circuit comprises:

an inverter having an output terminal and an input terminal coupled to receive the output clock signal; and a capacitor coupled to the output terminal of the inverter.

4. The memory device of claim 3 wherein the inverter comprises:

a first transistor coupled to the capacitor;

a second transistor coupled to the capacitor;

a current source coupled in series with the first transistor; and a current sink coupled in series with the second transistor.

5. The memory device of claim 1 wherein the duty cycle corrector circuit comprises:

a first switch having a control input coupled to receive the input clock signal, the first switch being closed responsive to a first logic level of the input clock signal;

a second switch having a control input coupled to receive the input clock signal, the second switch being closed responsive to a second logic level of the input clock signal;

a first current regulating device coupled in series with the first switch between a first supply voltage and an output node, the first current regulating device having a control input coupled to receive the first control signal;

a second current regulating device coupled in series with the second switch between the output node and a second supply voltage; the second current regulating device having a control input coupled to receive the second control signal;

a capacitor coupled to the output node; and a level detector coupled to the output node, the level detector setting the output clock signal to a first logic level responsive to the voltage on the capacitor being greater than a first transition voltage and setting the output clock signal to a second logic level responsive to the voltage on the capacitor being less than a second transition voltage.

6. The system of claim 5 further comprising:

a third switch coupled in parallel with the first current regulating device, the third switch being structured to close responsive to the voltage on the capacitor being charged to at least the first transition voltage; and a fourth switch coupled in parallel with the second current regulating device, the fourth switch being structured to close responsive to the voltage on the capacitor being discharged to at least the second transition voltage.

7. The memory device of claim 5 wherein the first and second current regulating devices comprise respective first and second transistors having their gates coupled to receive the first and second control signals, respectively.

8. The memory device of claim 1 wherein the control circuit comprises:

a transconductance amplifier having a first input coupled to the duty cycle indicating circuit to receive the duty cycle feedback signal therefrom and a second input coupled to a reference voltage, the transconductance amplifier being structured to generate first and second currents through respective first and second output terminals, the first current corresponding to the difference in magnitude between the duty cycle feedback signal and the reference voltage, and the second current corresponding to the difference between a constant current and the first current; and an adjusting circuit generating the first control signal as a voltage corresponding to the first current and generating the second control signal as a voltage corresponding to the second current.

9. The memory device of claim 8 wherein the adjusting circuit comprises:

a first transistor having a gate coupled to transconductance amplifier to receive the first current therefrom, a source coupled to a first power supply voltage, and a drain coupled to the gate, the first transistor generating the first control signal at the drain of the first transistor;

a current mirror coupled to the transconductance amplifier to receive the second current therefrom, the current mirror generating a third current that is substantially equal to the second current; and a second transistor having a gate coupled to current mirror to receive the third current therefrom, a source coupled to a first power supply voltage, and a drain coupled to the gate, the second transistor generating the second control signal at the drain of the second transistor.

10. The memory device of claim 1 wherein the memory device comprises a dynamic random access memory.

11. The memory device of claim 10 wherein the memory device comprises a synchronous dynamic random access memory.

12. The memory device of claim 1 wherein the input clock signal comprises a clock signal applied to the memory device from an external source.

13. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory device coupled to the processor through the processor bus, the memory device comprising:

an array of memory cells;

an address decoder adapted to receive an address and to specify a location in the array of memory cells corresponding thereto;

a read/write circuit coupling data to and from the specified location in the array of memory cells;

a control logic circuit receiving command signals and generating control signals corresponding thereto; and a clock generator circuit receiving an input clock signal and generating from the input clock signal an output clock signal having a controllable duty cycle, the clock generator circuit comprising:

a duty cycle corrector circuit structured to generate the output clock signal from the input clock signal, the duty cycle corrector circuit being structured to transition the output clock signal to a first logic level responsive to a first transition of the input clock signal after a first delay that corresponds to a first control signal, the duty cycle corrector circuit being structured to further transition the output clock signal to a second logic level that is different from the first logic level responsive to a second transition of the input clock signal that is different from the first transition of the input clock signal after a second delay that corresponds to a second control signal;

a duty cycle indicating circuit coupled to receive the output clock signal from the duty cycle corrector circuit and to generate a duty cycle feedback signal corresponding thereto; and a control circuit coupled to the duty cycle indicating circuit and the duty cycle corrector circuit, the control circuit being structured to generate the first and second control signals as a function of the duty cycle feedback signal so that the first and second delays are selected to cause the output clock signal to have a predetermined delay.

14. The computer system of claim 13 wherein the duty cycle indicating circuit comprises an integrator circuit coupled to receive the output clock signal from the duty cycle corrector circuit and to generate as the duty cycle feedback signal a signal corresponding to the integral of the output clock signal with respect to time.

15. The computer system of claim 14 wherein the integrator circuit comprises:

an inverter having an output terminal and an input terminal coupled to receive the output clock signal; and a capacitor coupled to the output terminal of the inverter.

16. The computer system of claim 15 wherein the inverter comprises:

a first transistor coupled to the capacitor;

a second transistor coupled to the capacitor;

a current source coupled in series with the first transistor; and a current sink coupled in series with the second transistor.

17. The computer system of claim 13 wherein the duty cycle corrector circuit comprises:

a first switch having a control input coupled to receive the input clock signal, the first switch being closed responsive to a first logic level of the input clock signal;

a second switch having a control input coupled to receive the input clock signal, the second switch being closed responsive to a second logic level of the input clock signal;

a first current regulating device coupled in series with the first switch between a first supply voltage and an output node, the first current regulating device having a control input coupled to receive the first control signal;

a second current regulating device coupled in series with the second switch between the output node and a second supply voltage; the second current regulating device having a control input coupled to receive the second control signal;

a capacitor coupled to the output node; and a level detector coupled to the output node, the level detector setting the output clock signal to a first logic level responsive to the voltage on the capacitor being greater than a first transition voltage and setting the output clock signal to a second logic level responsive to the voltage on the capacitor being less than a second transition voltage.

18. The computer system of claim 17 further comprising:

a third switch coupled in parallel with the first current regulating device, the third switch being structured to close responsive to the voltage on the capacitor being charged to at least the first transition voltage; and a fourth switch coupled in parallel with the second current regulating device, the fourth switch being structured to close responsive to the voltage on the capacitor being discharged to at least the second transition voltage.

19. The computer system of claim 17 wherein the first and second current regulating devices comprise respective first and second transistors having their gates coupled to receive the first and second control signals, respectively.

20. The computer system of claim 13 wherein the control circuit comprises:

a transconductance amplifier having a first input coupled to the duty cycle indicating circuit to receive the duty cycle feedback signal therefrom and a second input coupled to a reference voltage, the transconductance amplifier being structured to generate first and second currents through respective first and second output terminals, the first current corresponding to the difference in magnitude between the duty cycle feedback signal and the reference voltage, and the second current corresponding to the difference between a constant current and the first current; and an adjusting circuit generating the first control signal as a voltage corresponding to the first current and generating the second control signal as a voltage corresponding to the second current.

21. The computer system of claim 20 wherein the adjusting circuit comprises:

a first transistor having a gate coupled to transconductance amplifier to receive the first current therefrom, a source coupled to a first power supply voltage, and a drain coupled to the gate, the first transistor generating the first control signal at the drain of the first transistor;

a current mirror coupled to the transconductance amplifier to receive the second current therefrom, the current mirror generating a third current that is substantially equal to the second current; and a second transistor having a gate coupled to current mirror to receive the third current therefrom, a source coupled to a first power supply voltage, and a drain coupled to the gate, the second transistor generating the second control signal at the drain of the second transistor.

22. The computer system of claim 13 wherein the memory device comprises a dynamic random access memory.

23. The computer system of claim 22 wherein the memory device comprises a synchronous dynamic random access memory.

24. The computer system of claim 13 wherein the input clock signal comprises a clock signal a lied to the ice from an external source.

* * * * *

UNITED STATES PATENT AND TRADEMARK OFFICE
CERTIFICATE OF CORRECTION

PATENT NO. : 6,744,281 B2
DATED : June 1, 2004
INVENTOR(S) : Ronnie M. Harrison

It is certified that error appears in the above-identified patent and that said Letters Patent is hereby corrected as shown below:

Title page,
Item [57], ABSTRACT,
Line 6, reads "capacitor with the" should read -- capacitor when the --

Column 1,
Line 8, reads "divisional of pending U.S." should read -- divisional of U.S. --

Column 3,
Line 16, reads "causing that the" should read -- causing the --
Line 28, reads "Although, the duty cycle" should read -- Although the duty cycle --
Lines 32-33, reads "respect to FIG. 4 magnitude of the reference voltage $V_{REF}$. The system" should read -- respect to FIG. 4. --

Column 5,
Line 22, reads "both linear in" should read -- both linear and --
Line 36, reads "The transistors 72" should read -- The transistor 72 --
Line 40, reads "the current $I_1$, passing" should read -- the current $I_1$ passing --

Column 6,
Line 35, reads "inverter 42 an earlier" should read -- invertor 42 at an earlier --

Column 7,
Line 4, reads "ating combination" should read -- operating in combination --
Line 10, reads "coupled to directly to" should read -- coupled directly to --
Line 44, reads "an address 1 bus 22" should read -- an address bus 122 --

Column 9,
Line 45, reads "supply voltage; the second" should read -- supply voltage, the second --

Column 10,
Line 22, reads "coupled to transconduc-" should read -- coupled to the transconduc- --

Column 11,
Line 61, reads "supply voltage; the second" should read -- supply voltage, the second --

UNITED STATES PATENT AND TRADEMARK OFFICE
CERTIFICATE OF CORRECTION

PATENT NO. : 6,744,281 B2
DATED : June 1, 2004
INVENTOR(S) : Ronnie M. Harrison

It is certified that error appears in the above-identified patent and that said Letters Patent is hereby corrected as shown below:

Column 12,
Line 41, reads "coupled to transconduc-" should read -- coupled to the transconduc- --
Line 50, reads "coupled to current mirror" should read -- coupled to the current mirror --
Line 61, reads "clock signal a lied to the ice from" should read -- clock signal applied to the memory device from. --

Signed and Sealed this

Eighth Day of March, 2005

JON W. DUDAS
*Director of the United States Patent and Trademark Office*